United States Patent [19]
Fujita

[11] Patent Number: 5,416,748
[45] Date of Patent: May 16, 1995

[54] SEMICONDUCTOR MEMORY DEVICE HAVING DUAL WORD LINE STRUCTURE

[75] Inventor: Mamoru Fujita, Tokyo, Japan

[73] Assignee: NEC Corporation, Tokyo, Japan

[21] Appl. No.: 132,343

[22] Filed: Oct. 6, 1993

[30] Foreign Application Priority Data

Oct. 6, 1992 [JP] Japan .................. 4-266961

[51] Int. Cl.$^6$ .................. G11C 17/12
[52] U.S. Cl. .................. 365/230.06; 365/230.03; 365/189.08
[58] Field of Search ............ 365/51, 63, 230.03, 365/230.01, 230.06, 189.08, 189.11

[56] References Cited

U.S. PATENT DOCUMENTS

| | | | |
|---|---|---|---|
| 4,935,898 | 6/1990 | Miyaoka et al. | 365/230.03 |
| 5,140,550 | 8/1992 | Miyaoka et al. | 365/63 |
| 5,274,597 | 12/1993 | Ohbayashi et al. | 365/230.03 |

OTHER PUBLICATIONS

K. Noda et al., "A Boosted Dual Word-line Decoding Scheme for 256Mb DRAMSs", 1992 Symposium on VLSI Circuits, Digest of Technical Papers, pp. 112-113.

*Primary Examiner*—Joseph A. Popek
*Assistant Examiner*—Vu Le
*Attorney, Agent, or Firm*—Sughrue, Mion, Zinn, Macpeak & Seas

[57] ABSTRACT

A dynamic random access memory device of a dual word line structure is disclosed, which comprises a plurality of memory array blocks, each of the memory array blocks including at least one main-word line, a plurality of sub-word lines, a plurality of sub-word drivers having an input node connected to the main-word line, an output node connected to an associated one of the sub-word lines and a power node, each of the sub-word drivers responding to an active level of the main-word line to drive the associated sub-word line with a power voltage supplied to the power node, and a decoding unit for, when activated, supplying the power voltage to the power nodes of the sub-word line drivers, and the decoding unit of one of the memory array blocks being activated in response to address information.

6 Claims, 3 Drawing Sheets

SEMICONDUCTOR MEMORY DEVICE HAVING DUAL WORD LINE STRUCTURE

BACKGROUND OF THE INVENTION

The present invention relates to a semiconductor memory device and, more particularly, to an improvement in a dynamic random access memory device having a dual word line structure including main-word and sub-word lines.

As well known in the art, a semiconductor memory device having a plurality of word lines, one of which is selected and energized to an active level. In accordance with an increase in memory capacity, each of the word lines is inevitably prolonged to have a relatively large stray resistance. The word line is thereby required to be made of a metal to reduce its resistance. In accordance also with increase in memory capacity, a pitch for the word line is reduced. This means that the pitch for metal wiring is considerably made small, so that the increase in memory capacity is restricted. In other words, it is difficult to construct a memory device having a large memory capacity such as 64-Mb or 256-Mb with a conventional word line structure.

Therefore, such a memory device having a dual word line structure was proposed in "1992 SYMPOSIUM ON VLSI CIRCUITS", Digest of Technical Papers, pp. 112–113, entitled "A Boosted Dual Word-line Decoding Scheme for 256 Mb DRAMs". The memory device proposed therein has a plurality of main-word lines each made of a metal and a plurality of sub-word lines each made of polysilicon and serving also as gates of memory transistors connected thereto. One of the main-word lines is selected and driven by a row decoder in response to a part of row address signals. Each of the sub-word lines is connected to an output node of an associated one of sub-word drivers each further including an input node connected to an associated main-word line and a power node. The sub-word drivers arranged in the same column are connected at the power nodes thereof in common to an associated one of word drive decoders. Each of the word drive decoders responding to another part of row address signals to output and supply an energizing voltage to the power nodes of associated ones of the sub-word drivers. Accordingly, the sub-word driver drives the associated sub-word line to an active level in response to a selection level of the associated main-word line and to the energizing voltage from the associated word drive decoder.

With a such construction, the pitch for metal wiring as the main-word line is widened, so that each memory cell size is made small and a great number of memory cells are formed between the adjacent main-word lines. Accordingly, a memory device having a lager memory capacity such as 64-Mb or 256-Mb can be constructed without increase in chip area.

In the memory device as described above, however, the sub-word drivers arranged in the same column are connected in common to the associated word drive decoder. That is, each word drive decoder has a remarkably large stray capacitance and is required to charge and discharge such a large capacitance in each data reading or writing cycle. The power consumption is thus made large and an operation speed is lowered.

SUMMARY OF THE INVENTION

It is therefore an object of the present invention to provide an improved memory device having a dual word line structure.

It is another object of the present invention to provide a dynamic memory device of a dual word line structure operating with reduced power consumption and at a high speed.

A semiconductor memory device according to the present invention comprises a plurality of memory array blocks, each of the memory array blocks including at least one main-word line, a plurality of sub-word lines, a plurality of sub-word drivers each having an input node connected to the main-word line, an output node connected to an associated one of the sub-word lines and a power node and responding to an active level of the main-word line to drive the associated sub-word line with a power voltage supplied to the power node thereof, and a decoding unit for, when activated, supplying the power voltage to the power nodes of the sub-word drivers, and the decoding unit in one of the memory array blocks being activated in response to address information.

With such a structure, the number of the sub-word drivers connected in common to a power voltage supply line is reduced, so that the charging and discharging currents are made small. The power consumption is thereby reduced.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
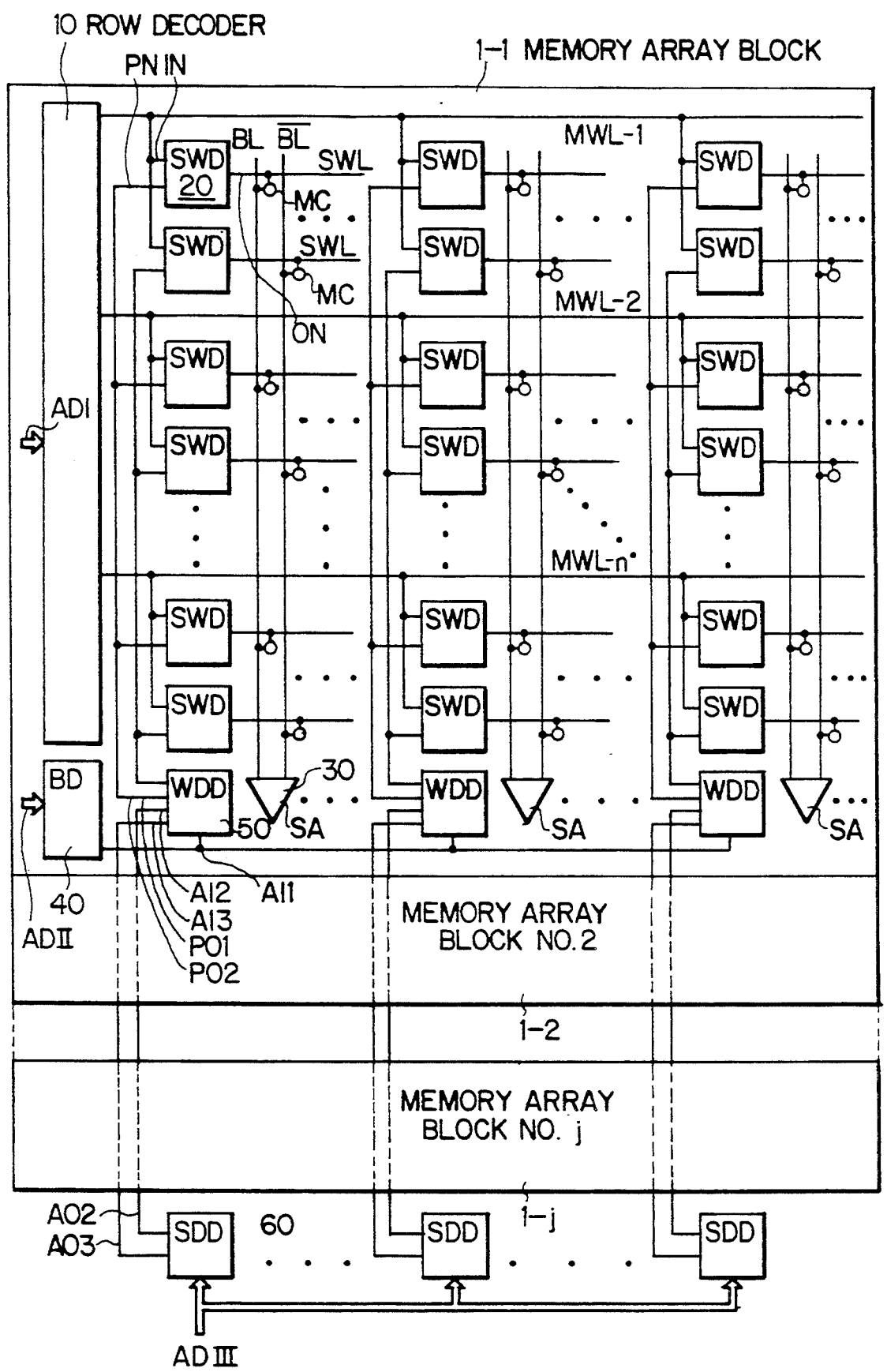
FIG. 1 is a block diagram illustrative of a memory device according to an embodiment of the present invention.

Referring to FIG. 1, a semiconductor memory device according to an embodiment of the present invention is constructed as a dynamic random access memory and includes a plurality of memory array blocks 1—1 to 1-j. Since each of the memory array blocks has the same construction as one another, only the memory array block 1—1 is shown in the drawing and will be explained in detail below.

The memory array block 1—1 includes a plurality of main-word lines MWL-1 to MWL-n arranged in a plurality of rows which are in turn connected to a row decoder 10. This decoder 10 responds to a part of row address signal information ADI and selects and drives one of the main-word lines MWL to an active high level. Provided between the adjacent two main word lines MWL are sub-word drivers (SWD) 20 arranged in two rows and M columns. Each of the sub-word drivers 20 has an input node IN connected to an associated one of the main-word lines MWL, an output node ON connected to an associated sub-word line SWL and a power node PN.

Figure 2:
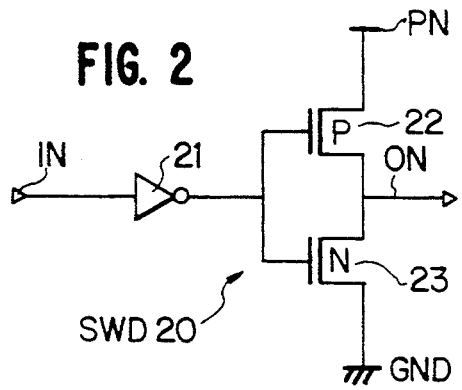
FIG. 2 is a circuit diagram illustrative of a sub-word driver shown in FIG. 1.

Referring to FIG. 2, the sub-word driver (SWD) 20 includes an inverter 21 having an input connected to the input node IN and P-channel and N-channel MOS transistors 22 and 23 having a gate connected to the output of the inverter 21. The transistors 22 and 23 are connected in series between the power node PN and a ground terminal GND, the connection point thereof is lead out as the output node ON which is in turn connected to the sub-word line SWL. If desired, each of the sub-word drivers SWD may have the same construction as that disclosed in the above mentioned reference.

Turning back to FIG. 1, the memory array block 1 further includes a plurality of bit line pairs BL and BL intersecting the sub-word lines SWL. A plurality of memory cells MC consisting of one transistor and one capacitor are disposed at different ones of the intersections of the sub-word lines and the bit line pair. Each bit line pair are connected to an associated one of sense amplifiers (SA) 30 in a manner as well known in the art.

The memory array block further includes a plurality of word drive decoders (WDD) 50 provided correspondingly to each column of the sub-word driver (SWD) array. Each of the word drive decoders 50 has a first power output node PO1 connected in common to the power nodes PN of the odd-numbered ones of the sub-word drivers arranged in the same associated column, a second power output node PO2 connected in common to the power nodes PN of the even-numbered ones thereof. The word drive decoder 50 further has first, second and third address input nodes AI1, AI2 and AI3.

Figure 3:
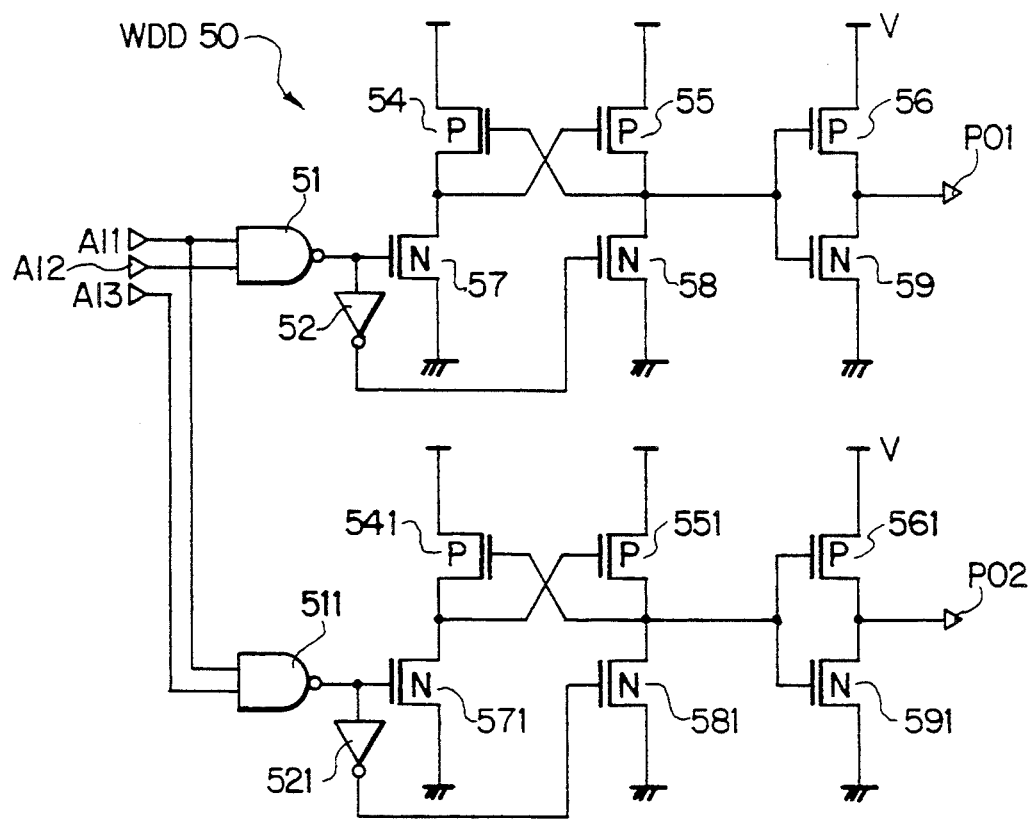
FIG. 3 is a circuit diagram illustrative of a word drive decoder shown in FIG. 1.

Turning to FIG. 3, each of the word drive decoder (WDD) 50 includes two NAND gates 51 and 511, two inverters 52 and 521, six P-channel MOS transistors 54–56 and 541–561 and six N-channel MOS transistors 57–59 and 571–591 which are connected as shown. Therefore, when the address input node AI1 takes an active high level and the address input node AI2 (or AI3) takes the active high level, the output node PO1 (or PO2) takes a potential level substantially equal to a power voltage V applied to the transistor 56 (561). In the case of the address input node AI1 taking the inactive low level, on the other hand, both of the output nodes PO1 and PO2 takes the ground level irrespective of the contents of the remaining address input nodes AI2 and AI3.

Turning back again to FIG. 1—1, the memory array block 1 further includes a block decoder (BD) 40 having an address output node AO1 connected in common to the first address input node AI1 of the word drive decoder 50. The block decoder 40 responds to another part of the address information ADII and changes the its output node AO1 to the active high level.

In addition to the memory array blocks 1—1 to 1-j each thus constructed, the memory device shown FIG. 1 further includes a plurality of sub-word driver decoders (SDD) 60 provided correspondingly to associated one of the word drive decoders 50 in each of the memory array blocks. Each of the sub-word drive decoders 60 includes first and second address output nodes AO2 and AO3 which are in turn connected respectively to the address input nodes AI2 and AI3 of the associated word drive decoder 50. The sub-word drive decoder 50 responds to still another part of the address information ADIII to change one of the its output nodes AO2 and AO3.

Figure 4:
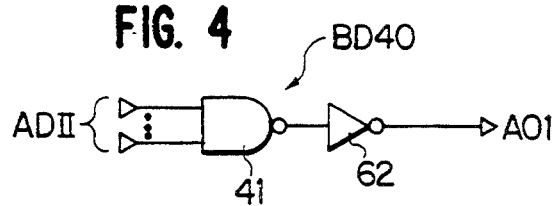
FIG. 4 is a circuit diagram illustrative of a block decoder shown in FIG. 1.

Turning to FIG. 4, the block decoder 40 includes a NAND gate 41 and an inverter 42 which are connected as shown. Accordingly, if all the address inputs takes the high level, the output node AO1 takes the active high level.

Figure 5:
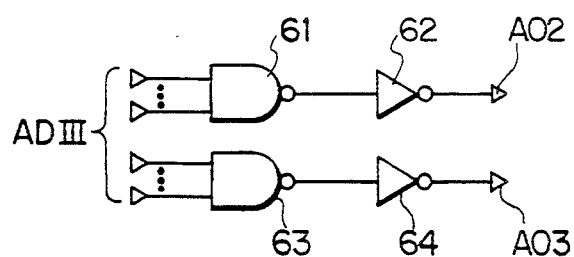
FIG. 5 is a circuit diagram illustrative of a sub-word drive decoder shown in FIG. 1.

Referring to FIG. 5, each of the sub-word drive decoders 60 includes two NAND gates 61 and 63 and two inverters 62 and 64 to produce the address outputs AO2 and AO3.

In operation, the row decoder 10 in each memory array block selects and drives one of the main-word lines MWD in response to the address information ADI which is derived from a set of row address signals (not shown). Further derived from the set of row address signals are the address information ADII and ADIII. The address information ADII is supplied to the block decoder 40 in each memory array block, so that only one block decoder 40 changes the its output node AO1 to the active high level. In contrast, all the sub-word drive decoders 60 changes one of its output nodes AO2 and AO3 to the active high level in response to the address information ADIII.

Assuming that the block decoder 40 in the memory array block 1—1 outputs the active high level at the output nodes AO1 and each of the sub-word drive decoders 60 outputs the active high level at its output nodes AO2, transistors 56 and 591 (FIG. 3) are turned on, whereas the transistors 59 and 561 are turned off. Accordingly, each of the word drive decoders 50 in the memory array block 1—1 drives and charges the line between the power output node PO1 and power input node PN to the power voltage V and drives and discharges the other line between the power output node PO2 and power input node PN to the ground level. Since the number of the sub-word drivers 20 connected in common to the corresponding word drive decoder 50 is restricted to form small stray capacitance on each line between the power output and input nodes PO and PN, the charging and discharging current are relatively small to suppress the power consumption. The time required to charge and discharge the power line is also made small to perform a high speed operation.

Assuming further that the main-word line MWL-1 is selected, the sub-word drivers arranged in the first column drive the corresponding sub-word lines SWL to the power voltage V. The memory cells connected to the sub-word lines SWL thus selected are subjected to a data read operation or a data write operation.

Thus, the memory device according to this embodiment has a large memory capacity and operates at a high speed with low power consumption.

Figure 6:
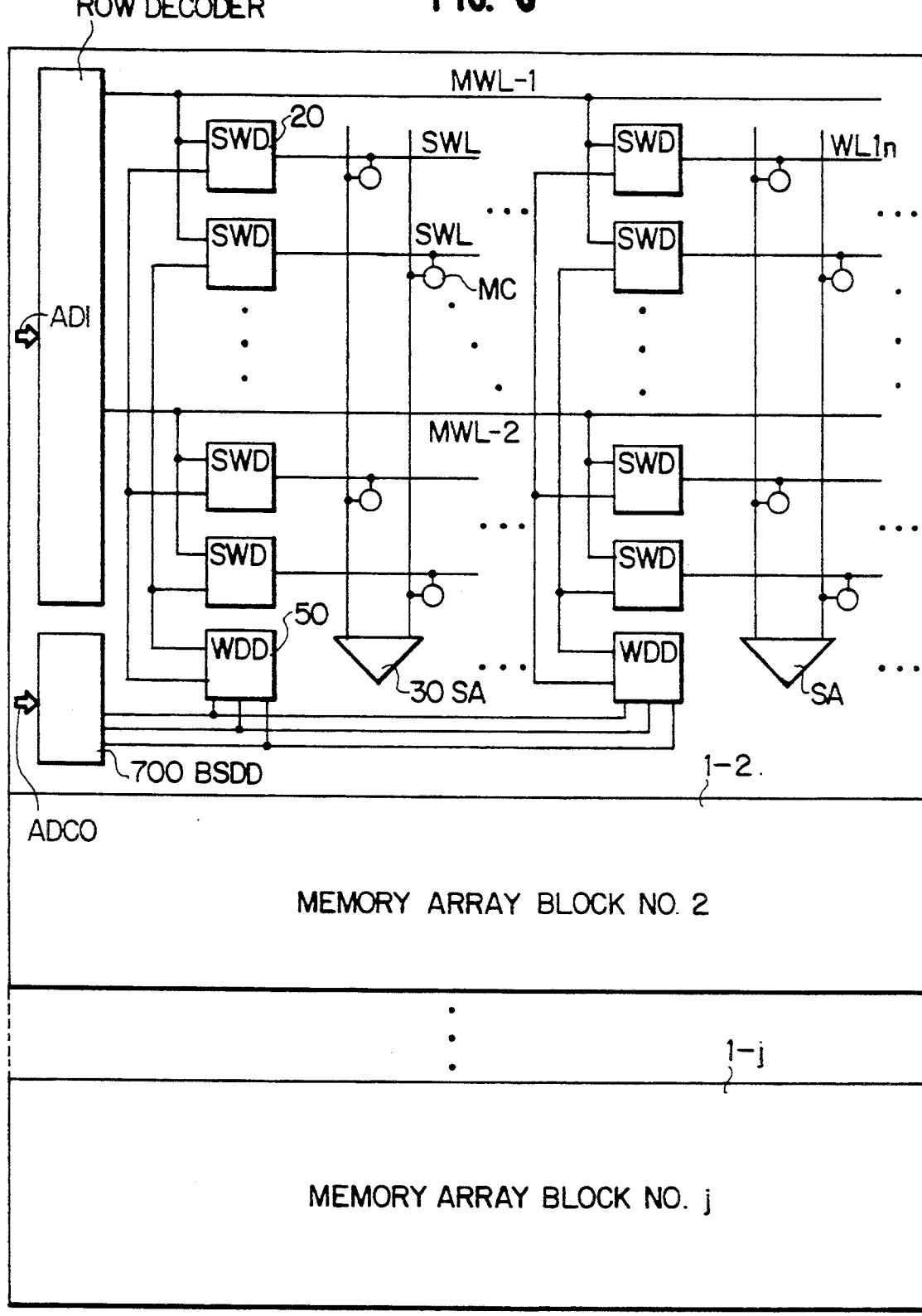
FIG. 6 is a block diagram illustrative of a memory device according to another embodiment of the present invention.

Referring to FIG. 6, there is shown another embodiment of the present invention in which the same constituents as those shown in FIG. 1 are denoted by the same reference numerals to omit further description thereof. In this embodiment, each of the memory array blocks 1—1 to 1-j includes a block and sub-word drive decoder (BSDD) 700 in place of the block decoder 40 in FIG. 1. The sub-word drive decoders 60 of FIG. 1 are further omitted in the present embodiment. In other words, the block and sub-word drive decoder 700 performs the functions of the block decoder and sub-word drive decoder. To this end, the address information containing the address information ADII and AD III is supplied to the decoder 700. In this embodiment, the required chip area is further reduced because of the absence of the decoders 60.

It is apparent that the present invention is not limited to the above embodiments but may be modified and changed without departing from the scope and spirit of the invention. For example, the number of sub-word lines provided between the adjacent two word lines and arranged in the same column may be increased to four or more. The word drive decoder and the block decoder (block and sub-word drive decoder) can be proved every main-word line.

I claim:

1. A semiconductor memory device comprising a plurality of memory array blocks, each of said memory array blocks including at least one main-word line, a plurality of sub-word lines, a plurality of sub-word drivers each having an input node connected to said main-word line, an output node connected to an associated one of said sub-word lines, a reference node supplied with a fixed voltage and a power node supplied with a variable voltage, each of said sub-word drivers forming an electrical path between said output node and said power node to drive said associated sub-word line to said variable voltage in response to an active level of said main word line and forming an electrical path between said output node and said reference node to drive said associated sub-word line to said fixed voltage in response to an inactive level of said main-word line, and a decoder unit for, when activated, supplying a power voltage to said power node of each of said sub-word drivers as said variable voltage and, when deactivated, said fixed voltage to said power node of each of said sub-word drivers as said variable voltage, said associated sub-word line being brought into a selection state by being driven to said power voltage and into a non-selection state by being driven to said fixed voltage, and said decoder unit in one of said memory array blocks being controlled to be activated and said decoder unit in each of remaining ones of said memory array blocks being controlled to be deactivated in response to address information.

2. The memory device as claimed in claim 1, wherein said decoding unit includes a plurality of word drive decoders each having an output end connected to the power node of an associated one of said sub-word drivers and an enable-node and a block decoder connected in common to the enable-nodes of said word drive decoders, said block decoder responding to said address information to output a selection level activating each of said word drive decoders.

3. The memory device as claimed in claim 1, wherein said sub-word drivers are arranged in a plurality of rows and a plurality of columns, said decoding unit including a plurality of word drive decoders and a block decoder, each of said word drive decoders having a first output nodes connected in common to the power nodes of the selected one or ones of the sub-word drivers arranged in the same column, a second output node connected in common to the power nodes of the remaining one or ones of the sub-word drivers arranged in the same column and an input node connected in common to said block decoder.

4. The memory device as claimed in claim 1, wherein each of said sub-word drivers includes a first transistor connected between said power node and said output node, a second transistor connected between said output node and said reference node and a logic circuit rendering said first and second transistors conductive and nonconductive, respectively, in response to said active level of said main-word line and said first and second transistors nonconductive and conductive, respectively, in response to said inactive level of said main-word line.

5. The memory device as claimed in claim 4, wherein each of said memory cell blocks includes a plurality of memory cells each being a dynamic memory cell consisting of one transistor and one capacitor.

6. A semiconductor memory device comprising a plurality of memory array blocks, each of said memory array blocks including at least one main-word line, a plurality of sub-word lines, a plurality of sub-word drivers each having an input node connected to said main-word line, an output node connected to an associated one of said sub-word lines, a reference node supplied with a fixed voltage and a power node supplied with a variable voltage, each of said sub-word drivers forming an electrical path between said output node and said power node to drive said associated sub-word line to said variable voltage in response to an active level of said main word line and forming an electrical path between said output node and said reference node to drive said associated sub-word line to said fixed voltage in response to an inactive level of said main-word line, and a decoder unit for, when activated, supplying a power voltage to said power node of each of said sub-word drivers, and said decoder unit in one of said memory array blocks being controlled to be activated and said decoder unit in each of remaining ones of said memory array blocks being controlled to be deactivated in response to address information.

* * * * *